US006882199B2

(12) United States Patent
Sugimura

(10) Patent No.: US 6,882,199 B2
(45) Date of Patent: Apr. 19, 2005

(54) VOLTAGE SENSING CIRCUIT

(75) Inventor: Naoaki Sugimura, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/730,997

(22) Filed: Dec. 10, 2003

(65) Prior Publication Data

US 2004/0113681 A1 Jun. 17, 2004

(30) Foreign Application Priority Data

Dec. 10, 2002 (JP) ....................................... 2002-358190

(51) Int. Cl.[7] .................................................. H03K 3/02

(52) U.S. Cl. ........................ 327/198; 327/143; 327/539

(58) Field of Search .............................. 327/50, 51, 72, 327/73, 77, 78, 143, 198, 538–541, 543; 323/313

(56) References Cited

U.S. PATENT DOCUMENTS 6,486,727 B1 * 11/2002 Kwong ....................... 327/534
6,801,058 B1 * 10/2004 Jiandong ..................... 327/51

FOREIGN PATENT DOCUMENTS

JP 11-311643 A 11/1999

* cited by examiner

*Primary Examiner*—Long Nguyen
(74) *Attorney, Agent, or Firm*—Nixon Peabody LLP; Donald R. Studebaker

(57) ABSTRACT

A voltage sensing circuit includes a bandgap generator that generates a bandgap voltage, and a monitoring unit that determines whether the bandgap generator is adequately powered. The bandgap voltage is used as a reference voltage for comparison with a voltage to be sensed; alternatively, a separate reference voltage is derived from the bandgap voltage. In the latter case, the circuit that derives the reference voltage amplifies the bandgap voltage, using a differential amplifier biased according to a bias voltage derived from the bandgap generator, and has a compensation circuit for compensating for amplifier offset due to variations in the bias voltage. In either case, if the monitoring unit decides that the bandgap generator is inadequately powered, it forces the sensing result signal to a fixed state, avoiding the output of erratic sensing results.

20 Claims, 7 Drawing Sheets

VOLTAGE SENSING CIRCUIT

BACKGROUND OF THE INVENTION

1. Field of the Invention

The present invention relates to a voltage sensing circuit for sensing, for example, the power supply voltage or a boosted voltage in a semiconductor integrated circuit.

2. Description of the Related Art

Japanese Unexamined Patent Application Publication No. 11-311643 describes a voltage sensing circuit comprising a bandgap current generator, a differential amplifier, and a voltage comparator. The bandgap current generator outputs a constant current with substantially no temperature dependence. The differential amplifier amplifies a reference voltage obtained by passing the constant current through a resistor. The voltage comparator compares the amplified reference voltage with the voltage to be sensed.

This voltage sensing circuit is extremely stable, being highly insensitive to temperature variations, but it is not entirely free of problems. One problem is that to generate the constant current, the bandgap current generator requires at least a certain minimum supply voltage level. If the power supply voltage is below this minimum level, the bandgap current generator cannot operate properly and the necessary temperature-independent reference voltage cannot be obtained. Another problem is that the differential amplifier that amplifies the reference voltage generally operates with a temperature-dependent bias current. A further problem is that the voltage level comparator (another differential amplifier) does not operate properly unless the voltages compared (the amplified reference voltage and the voltage to be sensed) have at least a certain minimum level. Consequently, the voltage sensing operation is not completely temperature-independent, and produces erratic results when the power supply voltage is too low.

The present invention addresses these problems.

SUMMARY OF THE INVENTION

A voltage sensing circuit according to the present invention includes at least a bandgap generator, a monitoring unit, and a voltage comparator, and may also include a reference voltage generator.

The bandgap generator generates a bandgap voltage and an internal voltage. The bandgap generator may, for example, generate a first internal current in a circuit that produces the internal voltage and a bias voltage, use the bias voltage to generate a second internal current mirroring the first internal current, use the second internal current as a bias current to generate the bandgap voltage, and output both the bandgap voltage and the bias voltage.

The reference voltage generator, if present, includes a resistor, a transistor coupled to the resistor, a differential amplifier, and a compensation circuit. The differential amplifier amplifies the bandgap voltage to generate an output voltage controlling the conductivity of the transistor, thereby generating a reference voltage in the resistor. The compensation circuit cancels voltage offset error in the differential amplifier. The differential amplifier and compensation circuit may operate by using the bias voltage output by the bandgap generator.

The monitoring unit monitors the internal voltage in the bandgap generator and determines whether it is powered adequately and can generate the bandgap voltage correctly.

The voltage comparator compares the bandgap voltage or the reference voltage with a voltage to be sensed, and generates a sensing signal indicating the comparison result.

In this voltage sensing circuit, the voltages and currents generated by the bandgap generator are substantially insensitive to temperature variations. The voltage comparator can therefore compare the voltage to be sensed with an accurate reference voltage and output an accurate temperature-independent result, provided the bandgap generator is adequately powered. When the bandgap generator is inadequately powered, i.e., when the power supply voltage is below a minimum necessary level, the monitoring unit detects this and forces the voltage comparator to set the sensing signal to a fixed state, thereby avoiding the output of erratic sensing results.

DETAILED DESCRIPTION OF THE INVENTION

Figure 1:
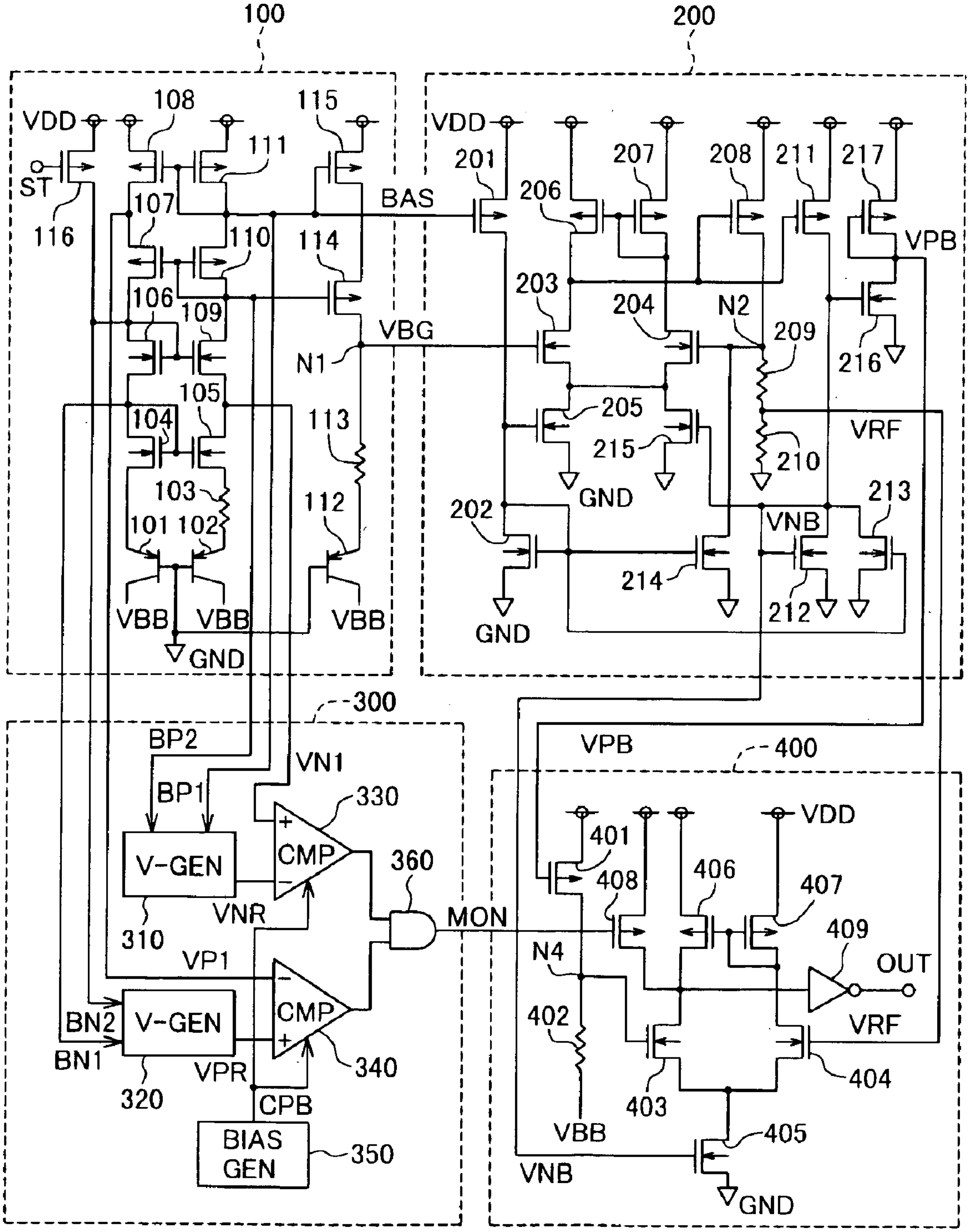
FIG. 1 is a circuit diagram of a voltage sensing circuit illustrating a first embodiment of the invention.

Examples of voltage sensing circuits embodying the invention will now be described with reference to the attached drawings, in which like elements are indicated by like reference characters. To simplify the descriptions, when a circuit element is connected to a node to which a given voltage is provided, the circuit element will be said to be connected to the given voltage, which may be, for example, the power supply voltage VDD, a boosted voltage VPP, the ground voltage GND, or the substrate voltage VBB. The substrate voltage VBB is always lower than the power supply voltage VDD, and may be lower than the ground voltage GND.

First Embodiment

The first embodiment of the invention is a voltage sensing circuit that senses the substrate voltage in a semiconductor integrated circuit. Referring to FIG. 1, the first embodiment comprises a bandgap generator 100 that generates a bandgap voltage VBG, a reference voltage generator 200 that generates a reference voltage VRF, a monitoring unit 300 that monitors internal voltages in the bandgap generator 100, and a voltage comparator 400 that shifts the substrate voltage VBB and compares the shifted substrate voltage with the reference voltage VRF.

The bandgap generator 100 includes a bandgap current generator comprising a pair of pnp transistors 101, 102, a resistor 103, and a pair of n-channel metal-oxide-semiconductor (NMOS) transistors 104, 105.

At the same voltage level, pnp transistor 102 has a higher current capacity than pnp transistor 101. The collectors of both pnp transistors 101, 102 are connected to the substrate and receive the substrate voltage VBB. The bases of both pnp transistors 101, 102 receive the ground voltage (GND). The emitter of pnp transistor 101 is connected to the source of NMOS transistor 104; the emitter of pnp transistor 102 is connected through resistor 103 to the source of NMOS transistor 105. The gates of both NMOS transistors 104, 105 are connected to the drain of NMOS transistor 104.

The drain of NMOS transistor 104 is connected through a further NMOS transistor 106 and p-channel metal-oxide-semiconductor (PMOS) transistors 107, 108 to the power supply voltage VDD, these four transistors 104, 106, 107, 108 being connected in series in the given order. The drain of NMOS transistor 105 is similarly connected in series through an NMOS transistor 109 and PMOS transistors 110, 111 to the power supply voltage VDD. The gates of both NMOS transistors 106, 109, both PMOS transistors 107, 110, and both PMOS transistors 108, 111 are connected, respectively, to the drains of NMOS transistor 106, PMOS transistor 110, and PMOS transistor 111. Transistors 104–111 form a series of NMOS and PMOS current mirror circuits sharing the same pair of current paths.

The bandgap generator 100 further comprises a pnp transistor 112, a resistor 113, and PMOS transistors 114, 115, which form a mirror circuit coupled to the bandgap current generator, and also includes a PMOS transistor 116 for applying a startup voltage. The pnp transistor 112, resistor 113, and PMOS transistors 114, 115 are connected in series in the given order from the substrate voltage VBB to the power supply voltage VDD. The base of pnp transistor 112 receives the ground voltage GND. The gates of PMOS transistors 114 and 115 are connected to the gates of PMOS transistors 110 and 111, respectively. The drain of PMOS transistor 114 is connected to a node N1 from which the bandgap voltage VBG is output. The gate voltage of PMOS transistor 115 is supplied to the reference voltage generator 200 as a bias voltage BAS. PMOS transistor 116 has its source connected to the supply voltage VDD and its drain connected to the drain of NMOS transistor 106; the gate of PMOS transistor 116 is driven by a startup signal ST.

The reference voltage generator 200 has a bias circuit that biases a differential amplifier that amplifies the bandgap voltage VBG. The bias circuit comprises a PMOS transistor 201 and an NMOS transistor 202, which conduct a bias current mirroring the current conducted by PMOS transistor 115 in the bandgap generator 100. The differential amplifier has a well-known configuration comprising NMOS transistor 203, 204, 205 and PMOS transistors 206, 207, in which NMOS transistor 205 acts as a constant current source. The current conducted by NMOS transistor 205 flows from the power supply VDD to ground, following one path through NMOS transistor 204 and PMOS transistor 206 and a parallel path through NMOS transistor 205 and PMOS transistor 207. The input terminals of the differential amplifier are the gates of NMOS transistors 204 and 205; the output terminal is the drain of NMOS transistor 204. The gates of the PMOS transistors 206, 207 are both connected to the drain of PMOS transistor 207. The constant current that flows through the differential amplifier is also referred to as an operating bias current.

In the bias circuit, the gate of PMOS transistor 201 receives the bias voltage signal BAS from the bandgap generator 100; the source of PMOS transistor 201 receives the power supply voltage VDD; the drain-of PMOS transistor 201 is connected to the drain and gate of NMOS transistor 202; and the source of NMOS transistor 202 is connected to ground (GND). The bias circuit conducts a bias current mirroring the internal currents in the bandgap generator 100. The drain voltage of PMOS transistor 201 is supplied as a first bias voltage to the gate of NMOS transistor 205, thus regulating the operating bias current of the differential amplifier. The gate of NMOS transistor 203, which is the first input terminal of the differential amplifier, receives the bandgap voltage VBG from node N1 in the bandgap generator 100. The output of the differential amplifier is supplied from the drain of NMOS transistor 203 to the gate of a PMOS transistor 208. The source and drain of PMOS transistor 208 are respectively connected to the power supply voltage VDD and a node N2, the voltage of which is fed back to the second input terminal of the differential amplifier at the gate of NMOS transistor 204. Node N2 is also connected through series resistors 209, 210 to ground. The reference voltage VRF is output to the voltage comparator 400 from the point at which resistors 209 and 210 are interconnected.

The reference voltage generator 200 also includes a compensation circuit comprising a PMOS transistor 211 and NMOS transistors 212, 213, 214, 215, which are used for canceling the voltage offset that may result from bias deviation in the differential amplifier. The source of PMOS transistor 211 is connected to the power supply voltage VDD; the gate of PMOS transistor 211 receives the output of the differential amplifier from the drain of NMOS transistor 203; the drain of PMOS transistor 211 is connected through parallel NMOS transistors 212, 213 to ground. The drain voltage of PMOS transistor 211 is used as an offset compensation voltage VNB, which is supplied as a second bias voltage to the gates of NMOS transistors 212 and 215 and to the voltage comparator 400. The gates of NMOS transistors 213 and 214 are coupled in current mirror fashion to the gate of NMOS transistor 202 and receive the first bias voltage. NMOS transistor 214 is connected in parallel with resistors 209 and 210 between node N2 and ground to divert current from resistors 209 and 210. NMOS transistor 215 is connected in parallel with NMOS transistor 205 to augment the operating bias current of the differential amplifier.

The reference voltage generator 200 further comprises an NMOS transistor 216 and a PMOS transistor 217, which generate a third bias voltage VPB. The source of NMOS transistor 216 is connected to ground, and the gate of NMOS transistor 216 receives the offset compensation voltage VNB. The drain of NMOS transistor 216 is connected to the drain and gate of PMOS transistor 217, and the source of PMOS transistor 217 is connected to the power supply voltage VDD. The third bias voltage VPB is output from the drain of PMOS transistor 217 to the voltage comparator 400.

The monitoring unit 300 comprises a voltage generator (V-GEN) 310 for generating a first internal reference voltage VNR from the source and drain voltages BP1, BP2 of PMOS transistor 110 in the bandgap generator 100, and another voltage generator 320 for generating a second internal reference voltage VPR from the source and drain voltages BN1, BN2 of NMOS transistor 106 in the bandgap generator 100. The monitoring unit 300 further comprises comparators 330, 340, a bias generator (BIAS GEN) 350, and an AND gate 360. Comparator 330 compares reference voltage VNR with the drain voltage VN1 of NMOS transistor 105 in the bandgap generator 100. Comparator 340 compares reference voltage VPR with the drain voltage VP1 of PMOS transistor 108 in the bandgap generator 100. The bias generator 350 supplies a bias voltage CPB to the comparators 330, 340. The AND gate 360 outputs the logical AND of the comparison results of the comparators 330, 340 as a monitor signal MON.

The voltage comparator 400 uses the third bias voltage VPB to shift the substrate voltage VBB, compares the shifted substrate voltage with the reference voltage VRF, and outputs the comparison result as a sensing signal OUT.

The substrate voltage VBB is shifted by a shifting circuit comprising a PMOS transistor 401 and a resistor 402. The source of PMOS transistor 401 is connected to the power supply voltage VDD, and its gate receives the third bias voltage VPB from the reference voltage generator 200. The drain of PMOS transistor 401 is connected to a node N4, which is connected through resistor 402 to the substrate voltage VBB.

The comparison is performed by a differential amplifier similar to the differential amplifier in the reference voltage generator 200, comprising NMOS transistors 403, 404, 405 and PMOS transistors 406, 407. The gate of NMOS transistor 403, which is the first input terminal of the differential amplifier, receives the shifted substrate voltage from node N4. The gate of NMOS transistors 404, which is the second input terminal of the differential amplifier, receives the reference voltage VRF from the reference voltage generator 200. The gate of the current source NMOS transistor 405 is biased by the offset compensation voltage VNB received from the reference voltage generator 200.

The voltage comparator 400 further comprises a PMOS transistor 408 and an inverter 409. The inverter 409 receives the output of the differential amplifier from the drain of NMOS transistor 403 and outputs the sensing signal OUT indicating the comparison result. PMOS transistor 408 is connected in parallel with PMOS transistor 406 between the power supply VDD and the drain of NMOS transistor 403; the gate of PMOS transistor 408 is driven by the monitor signal MON. When PMOS transistor 408 is switched on by the monitor signal MON, the sensing signal OUT is forced to the low logic level.

Figure 2:
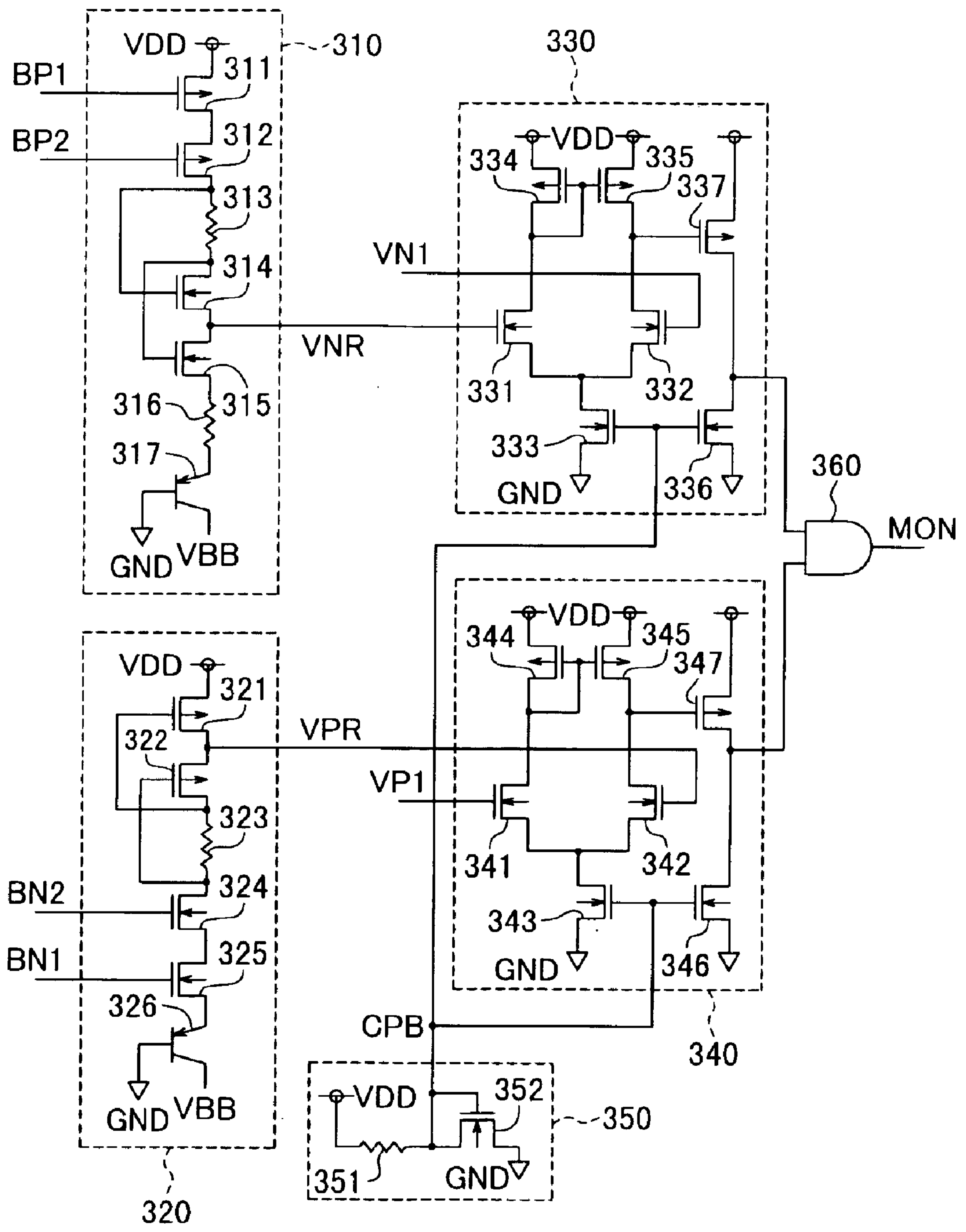
FIG. 2 is a circuit diagram showing an example of the monitoring unit in FIG. 1.

FIG. 2 is a circuit diagram showing an example of the detailed circuit structure of the monitoring unit 300 in FIG. 1.

Voltage generator 310 comprises PMOS transistors 311, 312, a resistor 313, NMOS transistors 314, 315, a resistor 316, and a pnp transistor 317 connected in series in the given order from the power supply VDD to the substrate voltage VBB. The gates of PMOS transistors 311, 312 receive voltages BP1, BP2, respectively. The gates of NMOS transistors 314, 315 are connected to the drains of PMOS transistor 312 and NMOS transistor 314, respectively, and the base of pnp transistor 317 receives the ground voltage GND. Reference voltage VNR is output from the drain of NMOS transistor 315.

Voltage generator 320 comprises PMOS transistors 321, 322, a resistor 323, NMOS transistors 324, 325, and a pnp transistor 326, which are connected in series in the given order from the power supply VDD to the substrate voltage VBB. The gates of NMOS transistors 324, 325 receive voltages BN2, BN1, respectively. The gates of PMOS transistors 321, 322 are connected to the drains of PMOS transistor 322 and NMOS transistor 324, respectively, and the base of pnp transistor 326 receives the ground voltage GND. Reference voltage VPR is output from the drain of PMOS transistor 321.

Comparator 330 comprises NMOS transistor 331, 332, 333 and PMOS transistor 334, 335, which form a differential amplifier, and an NMOS transistor 336 and a PMOS transistor 337, which form an output stage. The gates of NMOS transistors 331, 332 receive reference voltage VNR and voltage VN1, respectively, and the drain of NMOS transistor 336 outputs the comparison result signal. Similarly, comparator 340 comprises NMOS transistors 341, 342, 343 and PMOS transistors 344, 345, which form a differential amplifier, and an NMOS transistor 346 and a PMOS transistor 347, which form an output stage. The gates of NMOS transistors 341, 342 receive voltage VP1 and reference voltage VPR, respectively, and the drain of NMOS transistor 346 outputs the comparison result signal.

The bias generator 350 comprises a resistor 351 and an NMOS transistor 352 connected in series between the power supply voltage VDD and the ground voltage GND; the drain and gate of NMOS transistor 352 are both connected to resistor 351 at a point from which the bias voltage CPB is output to the gates of NMOS transistors 333, 336, 343, 346 in the comparators 330, 340.

The operation of the circuits in FIG. 1 will be described below.

When the power supply voltage VDD is switched on, the startup signal ST is driven low to turn on PMOS transistor 116 and start the operation of the bandgap generator 100. After the bandgap generator 100 is adequately powered and capable of operating correctly on its own, the startup signal ST is driven high to turn off PMOS transistor 116.

For the bandgap generator 100 to operate correctly, the power supply voltage VDD must satisfy both of the following conditions (1) and (2):

$$VDD>Vbe\mathbf{101}+Vth\mathbf{104}+Vth\mathbf{106}+Vdssat\mathbf{107}+Vdssat\mathbf{108} \quad (1)$$

$$VDD>Vbe\mathbf{102}+I1\times R\mathbf{103}+Vdssat\mathbf{105}+Vddsat\mathbf{109}+Vth\mathbf{110}+Vth\mathbf{111} \quad (2)$$

where, Vbe101 is the base-to-emitter voltage of pnp transistor 101, Vth104 is the threshold voltage of NMOS transistor 104, Vdssat107 is the drain-to-source voltage at which PMOS transistor 107 saturates, R103 is the resistance value of resistor 103, and the remaining symbols have analogous meanings: for example, Vdssat108 is the saturation drain-to-source voltage of PMOS transistor 108. I1 is the current conducted through the series circuit including pnp transistor 102 during normal operation. I1 is approximately equal to {K×(T/q)×ln(emitter area of pnp transistor 102/emitter area of pnp transistor 101)}/R103, where K is Boltzmann's constant, T is absolute temperature, q is the charge of the electron, and ln denotes the natural logarithm. During normal operation, an equal current I1 is conducted on the series circuit including pnp transistor 101.

When the power supply voltage VDD meets the conditions given by equations (1) and (2), since PMOS transistor 108 and NMOS transistor 105 operate in the saturation region, voltages VP1 and VN1 satisfy the following conditions:

$$VP1\leqq VDD-Vdssat\mathbf{108} \quad (3)$$

$$VN1\geqq Vbe\mathbf{102}+I1\times R\mathbf{103}+Vdssat\mathbf{105} \quad (4)$$

When the power supply voltage VDD does not meet the conditions given by equations (1) and (2), current I1 is replaced by a smaller current. If the currents conducted through the series circuits including pnp transistors 101 and 102 are now denoted I1s1 and I1s2, respectively, then since pnp transistor 102 is designed to have a larger current capacity than pnp transistor 101, the following condition is satisfied:

$$I1s1<I1s2<I1 \quad (5)$$

Feedback loops formed by the current mirrors comprising NMOS transistors 104, 105, 106, 109 and PMOS transistors 107, 108, 110, 111 ensure that, under the relationship in equation (5), the following conditions are satisfied, in which Vds108(I1s1) denotes the drain-to-source voltage of PMOS transistor 108 when conducting current I1s1, and other similar symbols have analogous meanings.

$$VP1=VDD-Vds108(I1s1)\geqq VDD-Vdssat108 \quad (6)$$

$$VN1=Vbe102(I1s2)+I1s2\times R103+Vds105(I1s2)\leqq Vbe102+I1\times R103+Vdssat105 \quad (7)$$

When the power supply voltage VDD meets the conditions given by equations (1) and (2), PMOS transistors 311, 312 in voltage generator 310 mirror the current conducted by PMOS transistors 111, 110 in the bandgap generator 100, and if pnp transistor 101 has the same emitter area as pnp transistor 326, then NMOS transistors 325, 324 in voltage generator 320 mirror the current conducted by NMOS transistors 104, 106 in the bandgap generator 100. The currents conducted through voltage generators 310 and 320 then become equal to current I1, and the reference voltage VNR output from voltage generator 310 is given by the following equation (8), in which Vgs314 and Vgs315 are the gate-to-source voltages of NMOS transistors 314 and 315.

$$VNR=Vbe317+I1\times R316+Vgs315+I1\times R313-Vgs314 \quad (8)$$

Circuit design constants are selected so that:

Emitter area of pnp transistor 102=emitter area of pnp transistor 317

$$R103=R316$$

$$I1\times R313=Vdssat315\ (=Vdssat105) \quad (9)$$

Under these conditions, Vgs314 and Vgs315 are equal, so equation (8) becomes:

$$VNR=Vbe102+I1\times R103+Vdssat105 \quad (10)$$

Therefore, from equations (4) and (10), voltage VN1 is equal to or greater than reference voltage VNR.

$$VN1\geqq VNR$$

Similarly, the reference voltage VPR output from voltage generator 320 is expressed as follows:

$$VPR=VDD-Vgs321-I1\times R323+Vgs322 \quad (11)$$

Circuit design constants are selected so that, $$I1\times R323=Vdssat321(=Vdssat108) \quad (12)$$

Equation (11) can thereby be simplified as follows:

$$VPR=VDD-Vdssat108 \quad (13)$$

Consequently, from equations (3) and (13), voltage VP1 is equal to or less than reference voltage VPR.

$$VP1\leqq VPR$$

If the power supply voltage VDD does not meet the conditions given by equations (1) and (2), then from equations (8) and (9), voltage VNR is expressed as follows:

$$VNR=Vbe102(I1s2)+I1s2\times R103+I1s2\times R313 \quad (14)$$

Since resistor 313 is a linear resistance and NMOS transistor 105 can be regarded as a non-liner resistance due to its operation in the non-saturation region, equations (5) and (9) imply the following relationship.

$$I1s2\times R313>Vds105(I1s2) \quad (15)$$

Therefore, from equations (7), (14), and (15), voltage VN1 is less than reference voltage VNR.

$$VN1<VNR$$

Similarly, from equations (11) and (12), reference voltage VPR is expressed by the following equation:

$$VPR=VDD-I1s1\times R323 \quad (16)$$

Since resistor 323 is a linear resistance and PMOS transistor 108 can be regarded as a non-liner resistance due to its operation in the non-saturation region, equations (5) and (12) imply the following relationship:

$$I1s1\times R323>Vds108(I1s1) \quad (17)$$

Consequently, from equations (6), (16) and (17), voltage VP1 is greater than reference voltage VPR.

$$VP1>VPR$$

To summarize the above, when the bandgap generator 100 receives an adequate power supply voltage VDD, the following relationships are satisfied:

voltage VN1≧reference voltage VNR, and voltage VP1≦reference voltage VPR

When the power supply voltage VDD is inadequate, the following relationships are satisfied:

voltage VN1<reference voltage VNR, and voltage VP1>reference voltage VPR

Voltage VN1 and reference voltage VNR are input to the non-inverting (+) and inverting (−) input terminals, respectively, of comparator 330 in the monitoring unit 300 and are compared. Voltage VP1 and reference voltage VPR are input to the inverting (−) and non-inverting (+) input terminals, respectively, of comparator 340 and are compared. The outputs of both comparators 330, 340 therefore go high when the power supply voltage VDD is adequate to satisfy the conditions in equations (1) and (2). Since the monitor signal MON is the logical AND of the outputs from comparators 330 and 340, the monitor signal MON is high when the bandgap generator 100 operates with an adequate power supply voltage VDD, and low otherwise.

In the reference voltage generator 200, since NMOS transistor 202 is in a current mirror relationship with NMOS transistors 205, 213, 214, the currents I202, I205, I213, I214 conducted through NMOS transistors 202, 205, 213, 214 are related as follows:

$$\begin{aligned} I202/(W/L)202 &= I205/(W/L)205 \\ &= I213/(W/L)213 \\ &= I214/(W/L)214 \end{aligned} \quad (18)$$

where, for example, (W/L)202 indicates the gate width-to-length ratio of NMOS transistor 202. Similar notation is used to indicate the current values and gate width-to-length ratios of other transistors in this equation and below.

The current I208 conducted through PMOS transistor 208 is equal to the sum of the currents conducted through resistor 210 and NMOS transistor 214, so the following equation is obtained.

$$I208=VRF/R210(=VN2/(R209+R210)+I214 \quad (19)$$

From equation (18), the above equation (19) can be rewritten as follows:

$$I208/(W/L)208=(VRF/R210)/(W/L)208+I202\times(W/L)214/((W/L)208\times(W/L)202) \quad (20)$$

If the input NMOS transistors 203 and 204 in the differential amplifier have the same characteristics, and the active load PMOS transistors 206 and 207 have the same characteristics, the gate width and length dimensions of NMOS transistors 205, 213, 214 and PMOS transistors 206 (207), 208, 211 are selected so that, $$2\times(W/L)205:(W/L)213:(W/L)214=(W/L)206(=(W/L)207):(W/L)211:(W/L)208 \quad (21)$$

Further, the relationship of the dimensions of NMOS transistors 212, 215, which form a mirror circuit, are set such that, $$2\times(W/L)215:(W/L)212=(W/L)206(=(W/L)207):(W/L)211 \quad (22)$$

The current conducted through PMOS transistor 211 is the sum of the currents conducted through NMOS transistors 212 and 213, so the following equation is obtained.

$$I212=I211-I213 \quad (23)$$

Therefore, from equations (18), (20), (21), and (23), the current I212 conducted by NMOS transistor 212 can be expressed as follows:

$$I212=(VRF/R210)\times(W/L)211/(W/L)208 \quad (24)$$

That is, current I212 is determined by reference voltage VRF, the resistance of resistor 210, and the dimension ratios of PMOS transistors 208 and 211. Since NMOS transistors 212 and 215 form a mirror circuit, current I215 can be expressed as follows:

$$I215=(VRF/R210)\times(W/L)211/(W/L)208\times(W/L)215/(W/L)212 \quad (25)$$

Further, from equations (18), (20) to (22), (24), and (25), the following equations are obtained.

$$I211/(W/L)211=(VRF/R210)/(W/L)208+I202\times(W/L)214/((W/L)211\times(W/L)202) \quad (26)$$

$$I214/(W/L)214=(VRF/R210)/(W/L)208+I202\times(W/L)205/(2\times(W/L)214\times(W/L)202) \quad (27)$$

$$I214/(W/L)214=I208/(W/L)208=I211/(W/L)211 \quad (28)$$

The condition for the equivalent input offset voltage of the differential amplifier to be zero is given by the following equation.

$$I203=I204(=I206=I207)=(I205+I215)/2 \quad (29)$$

In this case, since the gates and drains of PMOS transistors 206 and 207 have the same voltage, the currents conducted through these PMOS transistors 206, 207, and PMOS transistors 208, 211 are related as follows.

$$I206(=I207=(I205+I215)/2):I208:I211=(W/L)206:(W/L)208:(W/L)211 \quad (30)$$

The above equation (30) is equivalent to equation (28), so the differential amplifier operates with an equivalent input offset voltage of zero. Accordingly, the voltage at node N2 becomes equal to the bandgap voltage output from node N1, having almost no temperature dependence; the reference voltage VRF generated by dividing the voltage of node N2 with resistors 209, 210 also becomes substantially temperature-independent. Moreover, as can be appreciated from equations (20), (26), and (27), in the state in which the equivalent input offset voltage is zero, operation is stable despite variations in the resistance of resistor 210 and the current conducted by NMOS transistor 202.

Since NMOS transistors 212 and 216 form a current mirror, the following equation can be derived from equation (24):

$$\begin{aligned} I216 = I217 &= (VRF/R210)\times(W/L)211/(W/L)208\times(W/L)216/(W/L)212 \\ &= K\times(VRF/R210) \end{aligned}$$

where K is a constant determined by the dimension ratios of PMOS transistors 208, 211 and NMOS transistors 212, 216. This equation implies that a temperature-independent, stable constant current flows through NMOS transistor 216.

In the voltage comparator 400, since PMOS transistor 401 is in a current mirror relationship with PMOS transistor 217 in the reference voltage generator 200, the current I401 conducted through PMOS transistor 401 is proportional to the current I217 conducted through PMOS transistor 217 (=I216), and is thus proportional to (VRF/R210). Therefore, the shifted substrate voltage VN4 at node N4 is given by the following equation:

$$VN4=VBB+I401\times R402=VBB+\alpha\times VRF$$

where $\alpha$ is a design constant that can be set arbitrarily.

The voltage VN4 at node N4 is coupled to the first input terminal of the differential amplifier comprising transistors 403–407, and the substantially temperature-independent reference voltage VRF is coupled to the second input terminal. The monitor signal MON from the monitoring unit 300 is coupled to the gate of PMOS transistor 408; when it is high, which indicates an adequate power supply voltage VDD, PMOS transistor 408 turns off and a normal comparison operation is performed by the differential amplifier, the comparison result being inverted and output from the inverter 409 as a sensing signal OUT. The sensing signal OUT goes high if the substrate voltage VBB is normal, and goes low to warn that the substrate voltage VBB is too low. When the monitor signal MON is low, which indicates an inadequate power supply voltage VDD, PMOS transistor 408 turns on and the sensing signal OUT output from inverter 409 is forced to the low logic level, indicating a warning condition.

The voltage sensing circuit of the first embodiment has the following merits.

Since the monitoring unit 300 forces the sensing signal OUT to the low level when the bandgap generator 100 is not operating so as to generate a bias current and bandgap voltage correctly, the problem of unstable voltage sensing under abnormal conditions is prevented.

The differential amplifier in the reference voltage generator 200 operates as part of a voltage-to-current converter for generating a constant reference current from the temperature-independent bandgap voltage provided by the bandgap generator 100. A current determined by the dimensional ratios of the load PMOS transistors 206, 207 and output PMOS transistors 208, 211 is added to the operating bias current of the differential amplifier, and the current conducted through the resistors 209, 210 that convert the constant reference current to a reference voltage is reduced by an amount equal to the operating bias current of the differential amplifier, canceling any voltage offset error present in the differential amplifier. Consequently, it is possible to maintain a reference voltage and constant current that are substantially free of error due to variations in resistance values and variations in the bias current of the differential amplifier, thus eliminating the temperature dependence of the voltage sensing operation.

Second Embodiment

Figure 3:
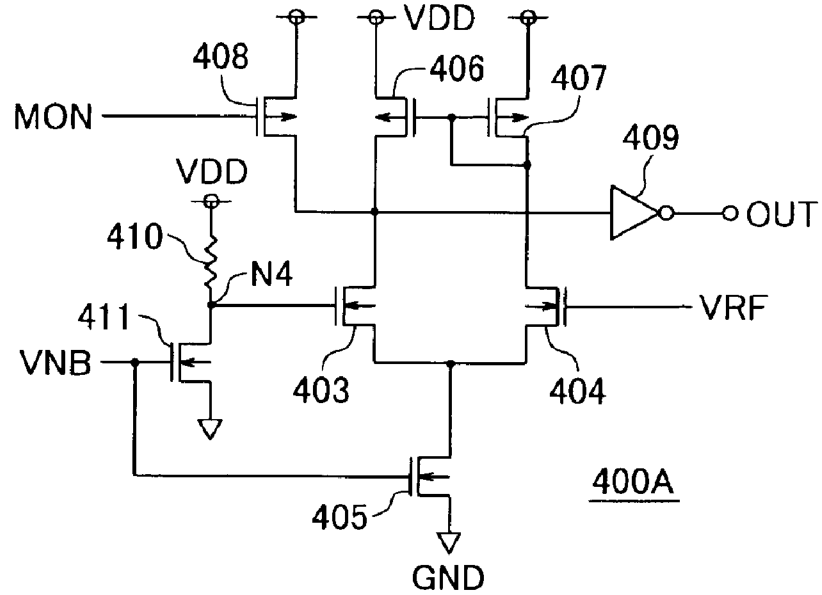
FIG. 3 is a circuit diagram of a voltage comparator used in a second embodiment of the invention.

FIG. 3 is a circuit diagram of a voltage comparator 400A used in a second embodiment of the invention, replacing the voltage comparator 400 in FIG. 1. The second embodiment also includes the bandgap generator 100, reference voltage generator 200, and monitoring unit 300 shown in FIG. 1.

Whereas the voltage comparator 400 in FIG. 1 compares the substrate voltage VBB with the reference voltage VRF, voltage comparator 400A compares the power supply voltage VDD with the reference voltage VRF and outputs a sensing signal OUT indicating the comparison result. In place of the shifting circuit comprising PMOS transistor 401 and resistor 402 in FIG. 1, accordingly, voltage comparator 400A has a shifting circuit comprising a resistor 410 connected between the power supply VDD and node N4, and an NMOS transistor 411 connected between node N4 and ground. The offset compensation voltage VNB obtained from the reference voltage generator 200 is used to bias the gate of NMOS transistor 411 as well as the gate of NMOS transistor 405. The rest of the circuit configuration is the same as in the voltage comparator 400 in FIG. 1.

In voltage comparator 400A, since NMOS transistor 411 is in a current mirror relationship with NMOS transistor 216 in the reference voltage generator 200, the current I411 conducted through NMOS transistor 411 is proportional to the current I216 conducted through NMOS transistor 216, which was shown above to be proportional to (VRF/R210). Therefore, the voltage VN4 at node N4 can be expressed as follows:

$$VN4=VDD-I411\times R410=VDD-\alpha\times VRF$$

where $\alpha$ is a design constant that can be set arbitrarily. This shifted power supply voltage VN4 is coupled to the first input terminal of the differential amplifier comprising transistors 403–407, and the substantially temperature-independent reference voltage VRF is coupled to the second input terminal of this differential amplifier. When the voltage sensing circuit is operating with an adequate power supply voltage VDD, so that the monitor signal MON is high and PMOS transistor 408 is turned off, VN4 is compared with VRF. The sensing signal OUT goes high to indicate that VN4 is higher than VRF and therefore that the power supply voltage VDD is above a predetermined level, and goes low to warn that the power supply voltage VDD is below the predetermined level.

When the monitor signal MON is low, that is, when the voltage sensing circuit is not receiving an adequate power supply voltage VDD, PMOS transistor 408 turns on and the sensing signal OUT is forced to the warning state (the low logic level).

Accordingly, the second embodiment has effects similar to those of the first embodiment, except that the voltage sensed is the power supply voltage VDD.

Third Embodiment

Figure 4:
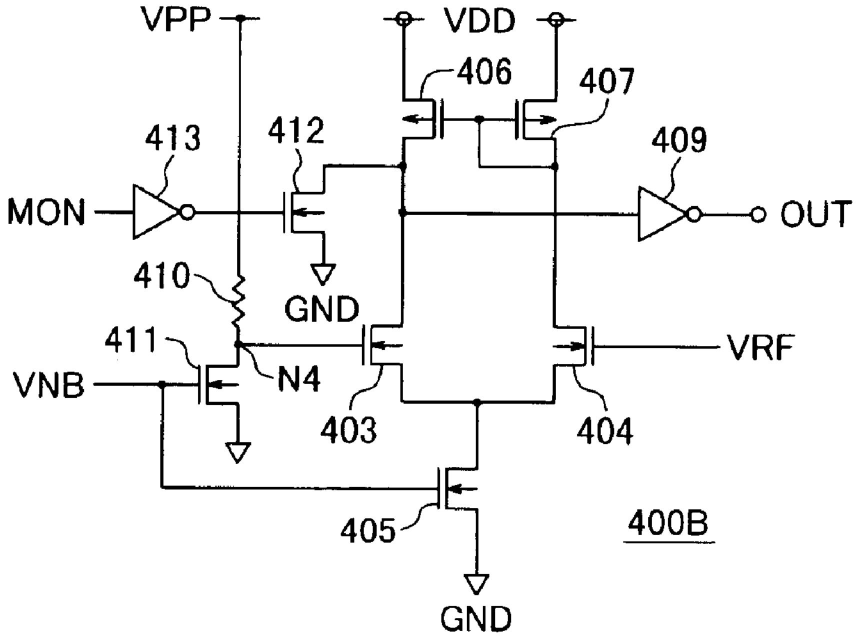
FIG. 4 is a circuit diagram of a voltage comparator used in a third embodiment of the invention.

FIG. 4 is a circuit diagram of a voltage comparator 400B used in a third embodiment of the invention in place of the voltage comparator 400 in FIG. 1. The third embodiment also includes the bandgap generator 100, reference voltage generator 200, and monitor unit 300 shown in FIG. 1.

Voltage comparator 400B compares a boosted voltage VPP with the reference voltage VRF with and outputs a sensing signal OUT indicating the comparison result. The boosted voltage VPP is generated internally in the integrated circuit in which the voltage sensing circuit is used, typically by boosting the power supply voltage VDD.

PMOS transistors 401, 408 and resistor 402 in the voltage comparator 400 in FIG. 1 are eliminated from voltage comparator 400B. A resistor 410 is connected between the boosted voltage VPP and node N4 and an NMOS transistor 411 is connected between node N4 and ground to form a shifting circuit. The offset compensation voltage VNB received from the reference voltage generator 200 biases the gates of both NMOS transistors 405 and 411, as in the second embodiment. In addition, an NMOS transistor 412 is coupled between the drain of NMOS transistor 403, which is the output terminal of the differential amplifier, and the ground voltage GND; the gate of NMOS transistor 412 receives the output of an inverter 413 that inverts the monitor signal MON received from the monitoring unit 300. The rest of the circuit configuration is the same as in the voltage comparator 400 in FIG. 1.

As in the second embodiment, NMOS transistor 411 is in a current mirror relationship with NMOS transistor 216 in the reference voltage generator 200, so the current I411 conducted through NMOS transistor 411 is proportional to the current I216 conducted through NMOS transistor 216, thus to (VRF/R210). The voltage VN4 at node N4 can therefore be expressed as follows:

$$VN4=VPP-I411\times R410=VPP-\alpha\times VRF$$

where $\alpha$ is a design constant that can be set arbitrarily. This voltage VN4 is coupled to the first input terminal of the differential amplifier comprising transistors 403–407, and the substantially temperature-independent reference voltage VRF is coupled to the second input terminal of this differential amplifier. When the voltage sensing circuit is operating with an adequate power supply voltage VDD, so that the monitor signal MON is high and NMOS transistor 412 is turned off, VN4 is compared with VRF. The sensing signal OUT goes high if the boosted voltage VPP is above a predetermined level, and goes low if the boosted voltage VPP is below the predetermined level.

When the monitor signal MON is low, that is, when the voltage sensing circuit is not receiving an adequate power supply voltage VDD, NMOS transistor 412 turns on and the sensing signal OUT output from the inverter 409 is forced high.

Accordingly, the third embodiment has effects similar to those of the first embodiment, except that the voltage to be sensed is a boosted voltage VPP, and the sensing signal OUT is forced high instead of low when the power supply voltage VDD is inadequate for proper operation.

Instead of a boosted voltage VPP, the third embodiment can sense various other internally generated voltages.

Fourth Embodiment

Figure 5:
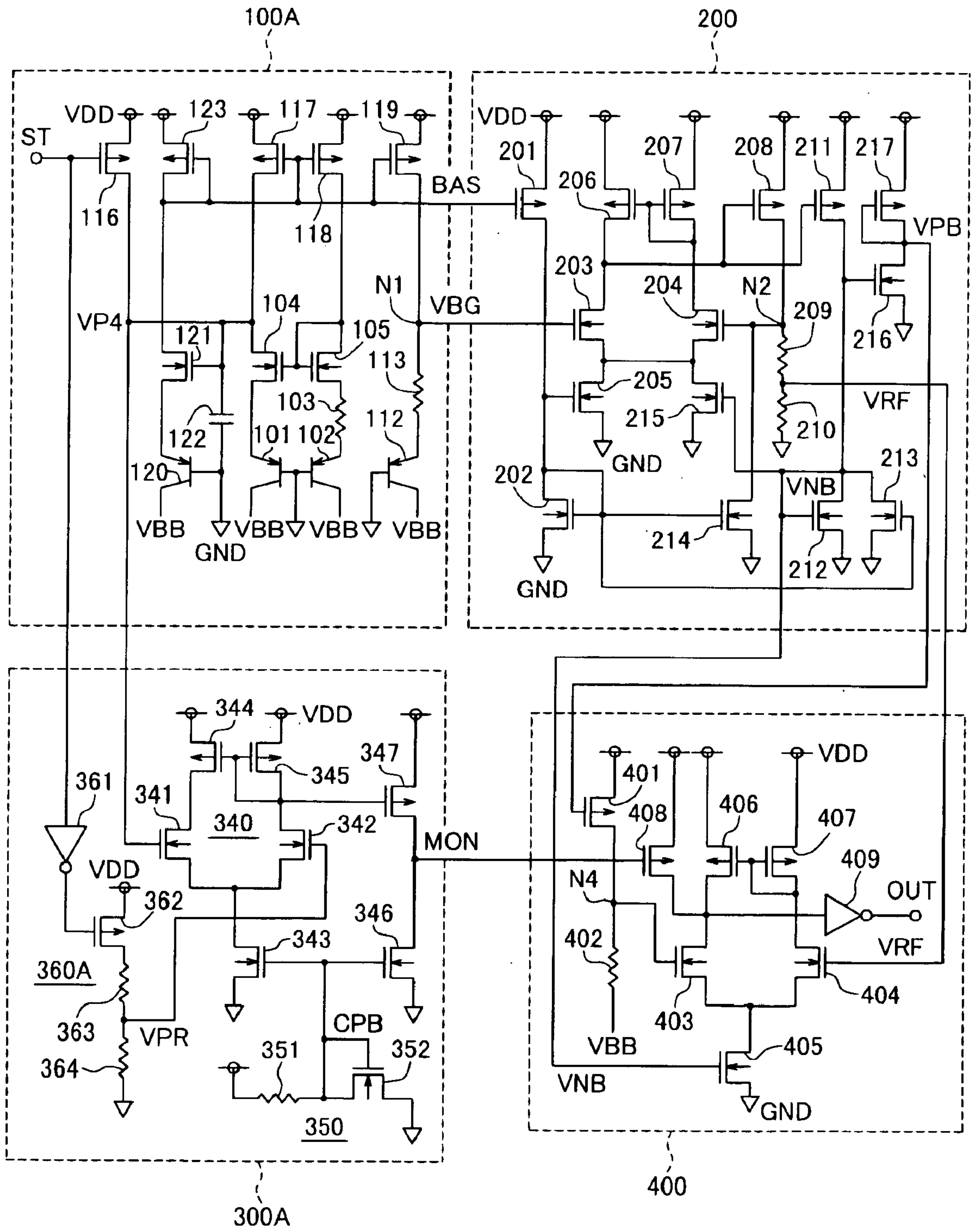
FIG. 5 is a circuit diagram of a voltage sensing circuit illustrating a fourth embodiment of the invention.

FIG. 5 is a circuit diagram of a voltage sensing circuit illustrating a fourth embodiment of the invention.

This voltage sensing circuit, like the one in FIG. 1, senses the substrate voltage VBB, but the bandgap generator 100 and monitoring unit 300 in FIG. 1 are replaced with a differently configured bandgap generator 100A and monitoring unit 300A.

Whereas in the bandgap generator 100 in FIG. 1, a feedback loop comprising NMOS and PMOS mirror circuits sharing the same current paths was used to stabilize the operating point of the bandgap current generator, in bandgap generator 100A, a feedback loop including a single-stage NMOS transistor amplifier is used. As in FIG. 1, the bandgap current generator includes pnp transistors 101, 102, a resistor 103, and NMOS transistors 104, 105, pnp transistor 102 being designed to have a higher current capacity than pnp transistor 101. The gates of NMOS transistors 104, 105 are both connected to the drain of NMOS transistor 105, and the drains of NMOS transistors 104 and 105 are connected through respective PMOS transistors 117 and 118 to the power supply voltage VDD. The bandgap generator 100A also includes a pnp transistor 112, a resistor 113, and a PMOS transistor 119 connected in a series circuit that mirrors the current conducted by the bandgap current generator, the gate of PMOS transistor 119 being connected to the gates of PMOS transistors 117 and 118. The bandgap voltage VBG is output from the drain of PMOS transistor 119 at node N1.

The feedback amplifier circuit in bandgap generator 100A includes a pnp transistor 120, an NMOS transistor 121, a capacitor 122, and a PMOS transistor 123. The pnp transistor 120 has its collector connected to the substrate voltage VBB, its base connected to the ground voltage GND, and its emitter connected to the source of NMOS transistor 121. The gate of NMOS transistor 121 is connected to the drain of NMOS transistor 104 and also through capacitor 122 to the ground voltage GND. The drain of NMOS transistor 121 is connected through PMOS transistor 123 to the power supply voltage VDD. The drain voltage of NMOS transistor 121 is a bias signal BAS that is supplied to the gates of PMOS transistors 117, 118, 119, and 123, and also to the bias circuit in the reference voltage generator 200.

Like the bandgap generator 100 in FIG. 1, bandgap generator 100A also has a PMOS transistor 116 driven by a startup signal ST. The source of PMOS transistor 116 is connected to the power supply voltage VDD. The drain of PMOS transistor 116 supplies a startup voltage to the drain of NMOS transistor 104 and the gate of NMOS transistor 121.

The monitoring unit 300A, which determines whether the bandgap generator 100A is operating so as to generate the bandgap voltage correctly, comprises a comparator 340, a bias generator 350, and a voltage generator 360A. The voltage generator 360A generates a reference voltage VPR by dividing the power supply voltage VDD when the startup signal ST is inactive (high). Comparator 340 compares the reference voltage VPR with the drain voltage VP4 of PMOS transistor 117 in the bandgap generator 100A. The bias generator 350 supplies a bias voltage CPB to comparator 340.

The voltage generator 360A comprises an inverter 361, a PMOS transistor 362, and a pair of resistors 363, 364. The inverter 361 inverts the startup signal ST. PMOS transistor 362 and resistors 363, 364 are connected in series between the power supply voltage VDD and ground, the gate of PMOS transistor 362 receiving the inverted startup signal ST output from the inverter 361. A reference voltage VPR is output from the point at which resistors 363 and 364 are interconnected. The circuit configurations of the comparator 340 and bias generator 350 are the same as in FIG. 2. The monitor signal MON is output directly from the comparator 340.

The operation of the circuit in FIG. 5 will be described below.

After the power supply voltage VDD has been switched on and the startup signal ST has been briefly driven low to start the bandgap generator 100A, the startup signal is driven high again and the monitoring unit 300A monitors the operation of the bandgap generator 100A. For the bandgap generator 100A to operate correctly, the power supply voltage VDD must satisfy both of the following conditions:

$$VDD>Vbe\mathbf{120}+Vdssat\mathbf{121}+Vdssat\mathbf{123} \quad (31)$$

$$VDD>Vbe\mathbf{102}+I\mathbf{1}\times R\mathbf{103}+Vth\mathbf{105}+Vddsat\mathbf{118} \quad (32)$$

where I1 is the current conducted through the series circuit including pnp transistor 102 during normal operation. I1 is approximately equal to {K×(T/q)×ln (emitter area of pnp transistor 102/emitter area of pnp transistor 101)}/R103, where K is Boltzmann's constant, T is absolute temperature, q is the charge of the electron, and ln denotes the natural logarithm. During normal operation, current I1 is also mirrored on the series circuit including pnp transistor 101.

When the power supply voltage VDD meets the condition given by equations (31) and (32), since PMOS transistor 117 and NMOS transistor 104 operate in the saturation region, voltage VP4 satisfies the following condition:

$$VP\mathbf{4}=Vbe\mathbf{101}+Vth\mathbf{104}\leqq VDD-Vdssat\mathbf{117} \quad (33)$$

When the power supply voltage VDD does not meet the conditions given by equations (31) and (32), current I1 is replaced by a smaller current. In this case, if the currents conducted through the series circuits including pnp transistors 101 and 102 are denoted I1s1 and I1s2, respectively, then since pnp transistor 102 has a higher current capacity than pnp transistor 101, the following condition is satisfied:

$$I\mathbf{1}s\mathbf{1}<I\mathbf{1}s\mathbf{2}<I\mathbf{1} \quad (34)$$

The series circuit comprising NMOS transistor 104 and PMOS transistor 117 is coupled to the series circuit comprising NMOS transistor 121 and PMOS transistor 123 in a drain-to-gate feedback loop. Given the relationship in equation (34) the following condition is satisfied.

$$VP\mathbf{4}=VDD-Vds\mathbf{117}(I\mathbf{1}s\mathbf{1})\geqq VDD-Vdssat\mathbf{117} \quad (35)$$

When the startup signal ST is high, the reference voltage VPR output from the voltage generator 360A is given by the following equation:

$$VPR=(VDD-Vdssat\mathbf{362})\times R\mathbf{364}/(R\mathbf{363}+R\mathbf{364}) \quad (36)$$

The values of resistors 363, 364 are selected so as to meet the following condition, in which VDD1 is the minimum value of the power supply voltage VDD that satisfies equations (31) and (32):

$$Vbe\mathbf{101}+Vth\mathbf{104}<(VDD\mathbf{1}-Vdssat\mathbf{362})\times R\mathbf{364}/(R\mathbf{363}+R\mathbf{364})<VDD\mathbf{1}-Vdssat\mathbf{117} \quad (37)$$

From this equation (37), when the bandgap generator 100A receives an adequate power supply voltage VDD, the following relationship is satisfied:

voltage VP4≦reference voltage VPR

When the power supply voltage VDD is inadequate, the following relationship is satisfied:

voltage VP4>reference voltage VPR

Voltage VP4 and reference voltage VPR are compared by the comparator 340. The monitor signal MON goes high when the bandgap generator 100A is operating with an adequate power supply voltage VDD, and otherwise goes low.

The reference voltage generator 200 and voltage comparator 400 operate as described in the first embodiment, so repeated descriptions will be omitted.

The voltage sensing circuit of the fourth embodiment adds the following effects to those of the first embodiment.

In the bandgap generator 100A, since a feedback loop comprising a single-stage NMOS transistor amplifier is used to obtain a stable operating point, variations of the voltage VP4 with respect to upward variation of the power supply voltage VDD are also controlled by negative feedback. Therefore, as long as an adequate power supply voltage VDD is available, the drain voltages of NMOS transistors 104 and 105 are unaffected by variations in the power supply voltage VDD. Bias current variations due to the effective channel-length modulation effect in NMOS transistors 104, 105 can be virtually eliminated. Therefore, the fourth embodiment is effective even when the substrate voltage VBB is sensed at such a low power supply voltage VDD that a cascode circuit configuration cannot be used to generate the bandgap voltage, and even when a fabrication process that leads to significant effective channel-length modulation in NMOS and PMOS transistors must be employed.

Fifth Embodiment

Figure 6:
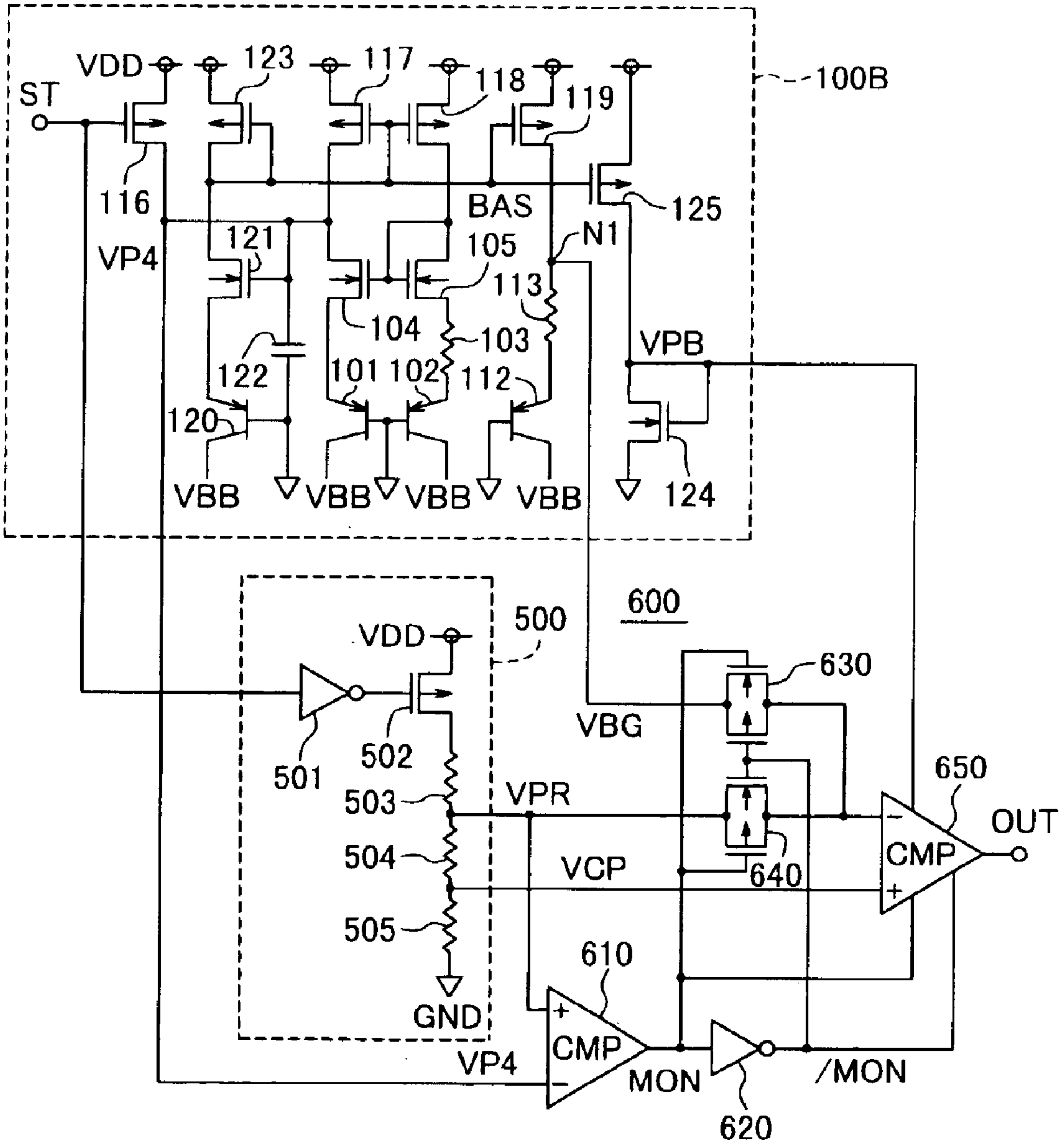
FIG. 6 is a circuit diagram of a voltage sensing circuit illustrating a fifth embodiment of the invention.

FIG. 6 is a voltage sensing circuit illustrating a fifth embodiment of the invention, which senses the power supply voltage VDD.

The voltage sensing circuit comprises a bandgap generator 100B having a slightly different structure from the bandgap generator 100A in FIG. 5, a voltage generator 500, and a voltage comparator 600.

In the bandgap generator 100B, an NMOS transistor 124 and PMOS transistor 125 are added to the bandgap generator 100A in FIG. 5 to output a bias voltage VPB. The source of NMOS transistor 124 is connected to the ground voltage GND, and both its gate and drain are connected to the drain of PMOS transistor 125. The source of PMOS transistor 125 is connected to the power supply voltage VDD, and its gate receives the bias signal BAS. The bias voltage VPB is output from the drain of PMOS transistor 125.

The voltage generator 500 divides the power supply voltage VDD to generate a pair of voltages VPR and VCP when the startup signal ST is inactive. The first voltage VPR is used as a reference voltage for monitoring the bandgap generator 100B. The second voltage VCP is used for sensing the power supply voltage VDD. The voltage generator 500 comprises an inverter 501, a PMOS transistor 502, and resistors 503, 504, 505. Inverter 501 inverts the startup signal ST and uses the inverted startup signal to drive the gate of PMOS transistor 502. The source of PMOS transistor 502 is connected to the power supply voltage VDD, and its drain is connected through series resistors 503, 504, 505 to the ground voltage GND. Voltage VPR is output from the point at which resistors 503, 504 are interconnected, and voltage VCP from the point at which resistors 504, 505 are interconnected. Both voltages VPR and VCP are proportional to the power supply voltage, voltage VCP being lower than voltage VPR.

The voltage comparator 600 comprises a comparator 610 and an inverter 620. The comparator 610 compares a voltage VP4 output from the bandgap generator 100B with the reference voltage VPR generated in the voltage generator 500, and outputs a monitor signal MON indicating whether an adequate power supply voltage VDD is supplied or not. The inverter 620 inverts the monitor signal MON and outputs an inverted monitor signal /MON.

The voltage comparator 600 further comprises switches 630, 640 for selecting either the bandgap voltage VBG output from the bandgap generator 100B or the reference voltage VPR generated in the voltage generator 500 on the basis of the monitor signals MON, /MON. The selected voltage VBG or VPR is supplied to the inverting input terminal of a comparator 650, and is compared with voltage VCP, which is supplied to the non-inverting input terminal of the comparator 650. The comparison result is output from the comparator 650 as a sensing signal OUT.

Figure 7A:
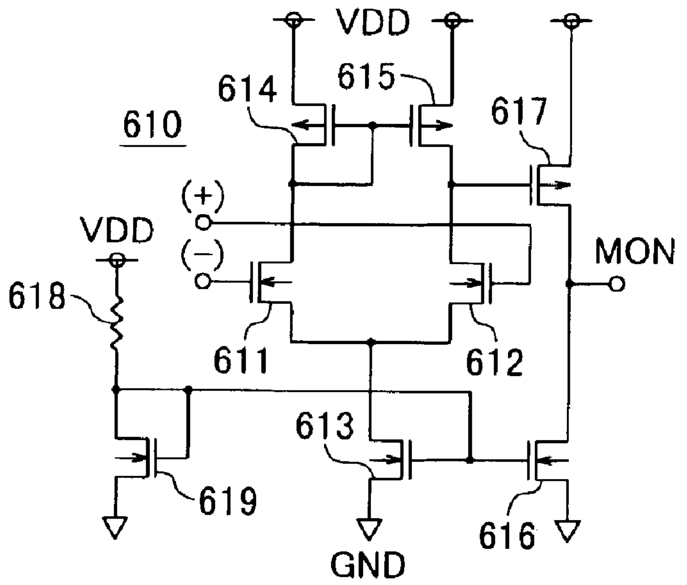
FIGS. 7A and 7B are circuit diagrams showing example of the internal structure of the comparators in FIG. 6.
Figure 7B:
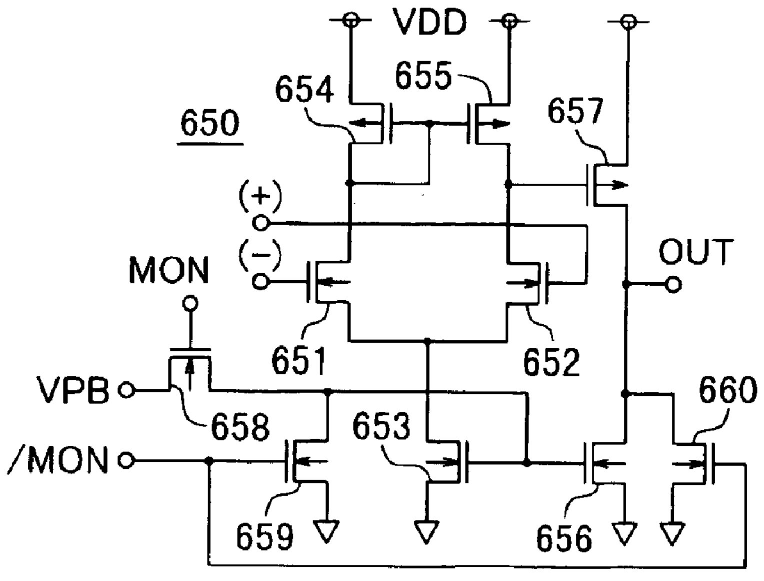

Examples of the internal structure of the comparators 610, 650 in FIG. 6 are shown in FIGS. 7A and 7B.

Referring to FIG. 7A, comparator 610 comprises a differential amplifier formed by NMOS transistors 611, 612, 613 and PMOS transistors 614, 615, an output stage formed by an NMOS transistor 616 and a PMOS transistor 617, and a bias voltage generator formed by a resistor 618 and an NMOS transistor 619. The gates of NMOS transistors 611 and 612 receive voltage VP4 and reference voltage VPR, respectively, and the drain of NMOS transistor 616 outputs the monitor signal MON.

Referring to FIG. 7B, comparator 650 comprises a differential amplifier formed by NMOS transistors 651, 652, 653 and PMOS transistors 654, 655, and an output stage formed by an NMOS transistor 656 and a PMOS transistor 657. The gate of NMOS transistor 651 is coupled to the output sides of switches 630, 640; the gate of NMOS transistor 652 receives voltage VCP. The sensing signal OUT is output from the drain of NMOS transistor 656. Comparator 650 further comprises a switching NMOS transistor 658 and NMOS transistors 659, 660. When the monitor signal MON is high and the inverted monitor signal /MON is low, NMOS transistor 658 passes the bias voltage VPB output from the bandgap generator 100B to the gates of NMOS transistors 653 and 656 as a bias voltage. When the monitor signal MON is low and the inverted monitor signal /MON is high, NMOS transistor 659 grounds the gates of NMOS transistors 653 and 656, thereby halting current flow through these transistors, and NMOS 660 holds the sensing signal OUT at the low logic level.

The operation of the circuit in FIG. 6 will be described below.

As in the fourth embodiment, for the bandgap generator 100B to operate correctly, the power supply voltage VDD must satisfy both of the following conditions:

$$VDD>Vbe\mathbf{120}+Vdssat\mathbf{121}+Vdssat\mathbf{123} \tag{31}$$

$$VDD>Vbe\mathbf{102}+I1\times R\mathbf{103}+Vth\mathbf{105}+Vddsat\mathbf{118} \tag{32}$$

When the startup signal is high, the first reference voltage VPR output from the voltage generator 500 is expressed as follows:

$$VPR=(VDD-Vdssat\mathbf{502})\times(R\mathbf{504}+R\mathbf{505})/(R\mathbf{503}+R\mathbf{504}+R\mathbf{505}) \tag{41}$$

If VDD1 is the minimum power supply voltage VDD that satisfies equations (31) and (32), the values of resistors 503, 504, 505 are selected so as to satisfy the following condition:

$$Vbe101+Vth104<(VDD1-Vdssat502)\times (R504+R505)/(R503+R504+R505)<VDD-Vdssat117 \tag{42}$$

From the above equation (42), when the bandgap generator 100B is operating with an adequate power supply voltage VDD, the following relationship is satisfied:

voltage VP4≦reference voltage VPR

When the bandgap generator 100B is not operating with an adequate power supply voltage VDD, the following relationship is satisfied:

voltage VP4>reference voltage VPR

Accordingly, the monitor signal MON output from the comparator 610 goes high when the bandgap generator 100B receives an adequate power supply voltage VDD, but otherwise goes low.

Therefore, when the power supply voltage VDD is adequate, switch 630 is switched on, switch 640 is switched off, and the bandgap voltage VBG output from the bandgap generator 100B is transmitted to the inverting input terminal of comparator 650, while the non-inverting input terminal receives voltage VCP from the voltage generator 500. Since the monitor signals MON and /MON are respectively high and low, in comparator 650, NMOS transistor 658 is turned on and NMOS transistors 659, 660 are turned off. Accordingly, the bias voltage VPB is transmitted through NMOS transistor 658 to the gates of NMOS transistors 653, 656, placing them in a current mirror relationship with NMOS transistor 124 in the bandgap generator 100B. The currents I653, I656 conducted through NMOS transistors 653, 656 are therefore given by the following equations:

$$I653=(W/L)653/(W/L)120\times I120=\alpha 653\times I1 \quad (43)$$

$$I656=(W/L)656/(W/L)120\times I120=\alpha 656\times I1 \quad (44)$$

where α653 and α656 are design constants. These design constants can be selected according to the dimension ratios of NMOS transistors 651, 652 and PMOS transistors 654, 655 with respect to PMOS transistor 657 so that the equivalent input offset voltage of comparator 650 is zero.

When the power supply voltage VDD is inadequate, switch 630 is switched off and switch 640 is switched on, so reference voltage VPR is transmitted from the voltage generator 500 to the inverting input terminal of comparator 650, while the non-inverting input terminal receives voltage VCP. In comparator 650, NMOS transistor 658 is switched off, NMOS transistors 659, 660 are switched on, and the sensing signal OUT is forced low. Moreover, the sensing signal OUT would go low even without being forced, since the inverting input terminal receives a higher voltage than the non-inverting input terminal. Output errors that might be caused by input impedance or parasitic capacitance when power is switched on or when an open circuit occurs are thereby prevented.

The voltage sensing circuit of the fifth embodiment has the following merits.

As in the fourth embodiment, a feedback loop circuit comprising a single-stage NMOS transistor amplifier is used to stabilize the operating point of the bandgap generator 100B. Therefore, as long as an adequate power supply voltage VDD is received, the drain voltages of NMOS transistors 104, 105 are unaffected by variations in the power supply voltage VDD, and variations in the generated bias current are virtually eliminated. Accordingly, the fifth embodiment is effective even at power supply voltages VDD too low for a cascode connection to be used to generate the bandgap voltage, and even when a fabrication process that leads to significant effective channel-length modulation in NMOS and PMOS transistors must be employed.

When the power supply voltage VDD is inadequate, not only is the sensing signal OUT output from the comparator 650 forced low; in addition the input terminals of comparator 650 receive voltages that would naturally drive the sensing signal OUT low. Consequently, both the problem of unstable sensing of an inadequate power supply voltage VDD and the problem of errors arising when the power supply voltage VDD is switched on or when an open circuit occurs are prevented.

In addition, when the power supply voltage VDD is inadequate, the supply of current to the comparator 650 is switched off, so that current is not consumed unnecessarily.

Sixth Embodiment

Figure 8:
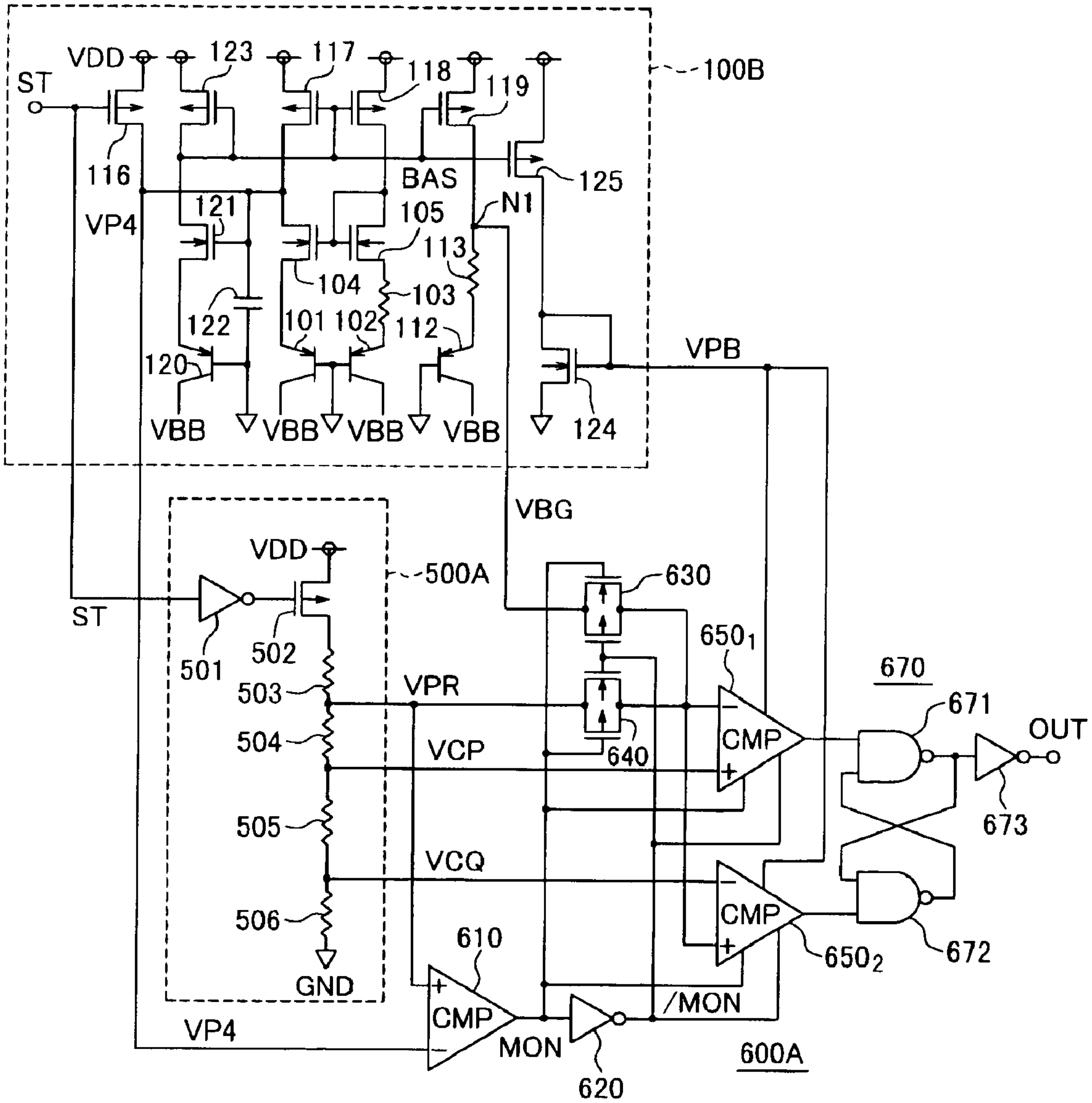
FIG. 8 is a circuit diagram of a voltage sensing circuit illustrating a sixth embodiment of the invention.

FIG. 8 is a voltage sensing circuit illustrating a sixth embodiment of the present invention. This circuit is generally similar to the voltage sensing circuit in FIG. 6, and uses the same bandgap generator 100B, but has a slightly different voltage generator 500A and voltage comparator 600A.

The voltage generator 500A generates a first (reference) voltage VPR for monitoring the bandgap generator 100B, and second and third voltages VCP, VCQ for sensing the power supply voltage VDD. The third voltage VCQ is lower than the second voltage VCP, which is lower than the first voltage VPR. The voltage generator 500A comprises an inverter 501, a PMOS transistor 502, and resistors 503 to 506. The source of PMOS transistor 502 is connected to the power supply voltage VDD, and its drain is connected through series resistors 503 to 506 to the ground voltage GND. The gate of PMOS transistor 502 receives the startup signal ST as inverted by the inverter 501. Voltages VPR, VCP, and VCQ are respectively output from the points at which resistors 503 and 504, resistors 504 and 505, and resistors 505 and 506 are interconnected.

The voltage comparator 600A includes the comparator 610, inverter 620, and switches 630, 640 described in the fifth embodiment, and a pair of comparators $650_1$ and $650_2$. Comparator $650_1$ compares the output signal from switch 630 or 640 with voltage VCP as in FIG. 6; comparator $650_2$ compares the output signal from switch 630 or 640 with voltage VCQ. The output terminals of comparators $650_1$ and $650_2$ are coupled to a set-reset flip-flop 670 comprising a pair of NAND gates 671, 672 and an inverter 673, from which the sensing signal OUT is output. The flip-flop 670 is set by a low output signal output from comparator $650_2$, provided the output signal from comparator $650_1$ is high, and is reset unconditionally by a low output signal from comparator $650_1$.

The operation of the circuit in FIG. 8 will be described below.

As in the voltage sensing circuit in FIG. 6, the monitor signal MON output from comparator 610 goes high when the power supply voltage VDD is adequate for operation of the bandgap generator 100B, and otherwise goes low.

When the power supply voltage VDD is adequate, the switches 630 and 640 are switched on and off, respectively, by the monitor signals MON and /MON. Therefore, the inverting and non-inverting input terminals of comparator 650, receive the bandgap voltage VBG from the bandgap generator 100B and voltage VCP from the voltage generator 500A, respectively. The non-inverting and inverting input terminals of comparator $650_2$ receive the bandgap voltage VBG and voltage VCQ, respectively. The bias voltage VPB is also supplied from the bandgap generator 100B to these comparators $650_1$, $650_2$ as a bias voltage to initiate the comparison operation.

While voltage VCP remains below the bandgap voltage VBG, the output signal of comparator $650_1$ remains low and the sensing signal OUT is held low even though the power supply voltage VDD is adequate.

When the power supply voltage VDD rises and voltage VCP exceeds the bandgap voltage VBG, the output signal of comparator $650_1$ goes high, releasing the forced reset of the flip-flop 670. When the power supply voltage VDD rises further and voltage VCQ exceeds the bandgap voltage VBG, the output signal of comparator $650_2$ goes low, setting the flip-flop 670 so that the sensing signal OUT goes high.

Once the flip-flop 670 is set, its state does not change even if the power supply voltage VDD falls and voltage VCQ becomes lower than the bandgap voltage VBG, sending the output signal of comparator $650_2$ to the high level. If the power supply voltage VDD falls so far that voltage VCP becomes lower than the bandgap voltage VBG and the output signal of comparator $650_1$ goes low, however, the flip-flop 670 is reset again and the sensing signal OUT goes low, and does not go high again until the power supply voltage VDD rises far enough for voltage VCQ to exceed the bandgap voltage VBG. The sensing signal OUT is accordingly output with hysteresis.

Other operations are the same as in the fifth embodiment.

The sixth embodiment provides the same effects as the fifth embodiment. In addition, since the voltage sensing circuit operates with hysteresis, once the power supply voltage VDD rises to the prescribed voltage and the sensing signal OUT is set, a slight drop in the power supply voltage VDD will not reset the sensing signal OUT. Consequently, the sixth embodiment has the effect of preventing system oscillation due to variations in the power supply voltage, which might be caused by power supply impedance in a system having a halt or wait function, in which current consumption changes significantly depending on the operating state.

As detailed above, the invented voltage sensing circuit employs a bandgap generator to generate a temperature-independent bandgap voltage, which may be used directly as a reference voltage or may be used to generate other reference voltages. In the latter case, if a reference voltage generator including a differential amplifier is used to amplify the bandgap voltage, the reference voltage generator also includes a compensation circuit that cancels temperature-dependent voltage offset error in the differential amplifier, so that the reference voltages are also temperature-independent. In any case, the voltage sensing circuit has a monitoring unit that determines whether the bandgap generator is receiving an adequate power supply voltage. If the power supply voltage is inadequate, the monitoring unit forces the sensing signal output from the voltage sensing circuit to indicate an abnormal state, eliminating the possibility of erratic sensing results at low power supply voltage levels.

The present invention is not limited to the exemplary embodiments described above. For example:

(a) The circuit configurations of the bandgap generators, reference voltage generators, and other circuit blocks shown in the drawings can be modified. Any other circuit configurations having equivalent functions may be used.

(b) The fourth embodiment may be modified by using a voltage comparator such as the one shown in FIG. 3 or 4 to sense the power supply voltage VDD or a boosted voltage VPP.

Those skilled in the art will recognize that many further variations are possible within the scope of the invention, which is defined in the appended claims.

What is claimed is:

1. A voltage sensing circuit comprising:

a bandgap generator generating an internal voltage and a bandgap voltage;

a monitoring unit monitoring the internal voltage of the bandgap generator, thereby determining whether the bandgap generator is adequately powered; and a voltage comparator comparing a voltage to be sensed with the bandgap voltage, or with a reference voltage derived from the bandgap voltage, thereby generating a sensing signal; wherein the monitoring unit outputs a signal that forces the voltage comparator to set the sensing signal to a fixed state when the bandgap generator is inadequately powered.

2. The voltage sensing circuit of claim 1, wherein the fixed state indicates that the voltage to be sensed is at an unsatisfactory level.

3. The voltage sensing circuit of claim 1, wherein the voltage comparator includes a transistor having a conductivity controlled by the signal output by the monitoring unit.

4. The voltage sensing circuit of claim 1, wherein the bandgap generator conducts an internal current from which the internal voltage is generated, and the monitoring unit includes:

a voltage generator for generating an internal reference voltage by mirroring the internal current of the bandgap current; and a comparator for comparing the internal voltage of the bandgap generator with the internal reference voltage.

5. The voltage sensing circuit of claim 1, wherein the voltage comparator compares the voltage to be sensed with said reference voltage derived from the bandgap voltage, further comprising a reference voltage generator for generating the reference voltage, the reference voltage generator including:

a first differential amplifier having a first input terminal, a second input terminal, and an output terminal, receiving the bandgap voltage at the first input terminal and generating an amplified bandgap voltage at the output terminal;

a first resistor; and a first transistor having a conductivity controlled by the amplified bandgap voltage, the first transistor supplying current to the first resistor, thereby generating said reference voltage and a feedback voltage, the feedback voltage being fed back to the second input terminal of the first differential amplifier.

6. The voltage sensing circuit of claim 5, wherein the bandgap generator generates an internal bias current from which the bandgap voltage is generated, the first differential amplifier includes a current source, and the reference voltage generator also includes:

a bias circuit mirroring the internal bias current of the bandgap generator, thereby generating a first bias voltage, and supplying the first bias voltage to the first differential amplifier to control the current source in the first differential amplifier; and a compensation circuit for compensating for voltage offset in the first differential amplifier due to variation of the first bias voltage.

7. The voltage sensing circuit of claim 6, wherein the reference voltage generator also includes a second resistor connected in series with the first resistor, the reference voltage being obtained from a point at which the first and second resistors are interconnected, the feedback voltage being obtained from a point at which the first transistor and the first resistor are interconnected.

8. The voltage sensing circuit of claim 7, wherein the compensation circuit comprises:

a second transistor having a conductivity controlled by the amplified bandgap voltage;

a third transistor connected in series with the second transistor, having a conductivity controlled by the first bias voltage, producing a second bias voltage at a point at which the second and third transistors are interconnected;

a fourth transistor connected in parallel with the third transistor, having a conductivity controlled by the second bias voltage;

a fifth transistor connected in parallel with the first and second resistors, having a conductivity controlled by the first bias voltage, for reducing current flow through the first and second resistors; and a sixth transistor connected in parallel with the current source in the first differential amplifier, having a conductivity controlled by the second bias voltage, for augmenting current flow through the first differential amplifier.

9. The voltage sensing circuit of claim 8, wherein the voltage comparator includes:

a shifting circuit for shifting the voltage to be sensed according to the second bias voltage; and a second differential amplifier conducting a current determined by the second bias voltage, for comparing the shifted voltage with the reference voltage.

10. The voltage sensing circuit of claim 8, wherein the reference voltage generator also includes a seventh transistor having a conductivity controlled by the second bias voltage, for generating a third bias voltage, and the voltage comparator includes:

a shifting circuit for shifting the voltage to be sensed according to the third bias voltage; and a second differential amplifier conducting a current determined by the second bias voltage, for comparing the shifted voltage with the reference voltage.

11. The voltage sensing circuit of claim 1, wherein the bandgap generator comprises:

a bandgap current generator generating an internal current and a voltage signal; and a feedback circuit amplifying and inverting the voltage signal generated by the bandgap current generator and feeding the amplified and inverted voltage signal back to the bandgap current generator.

12. The voltage sensing circuit of claim 11, wherein the voltage signal generated by the bandgap current generator is the internal voltage monitored by the monitoring unit.

13. The voltage sensing circuit of claim 1, wherein the voltage sensing circuit is formed on a substrate and the voltage to be sensed is a voltage of the substrate.

14. The voltage sensing circuit of claim 1, wherein the voltage sensing circuit is disposed in an integrated circuit and the voltage to be sensed is generated in the integrated circuit.

15. The voltage sensing circuit of claim 1, wherein the voltage to be sensed is a power supply voltage.

16. The voltage sensing circuit of claim 15, further comprising:

a voltage generator using resistors to divide the power supply voltage, thereby generating a first voltage and a second voltage lower than the first voltage;

a switching circuit controlled by the monitoring unit to select the bandgap voltage when the bandgap generator is adequately powered and the first voltage when the bandgap generator is inadequately powered; wherein the monitoring unit compares the internal voltage of the bandgap generator with the first voltage; and the voltage comparator compares the second voltage with the voltage selected by the switching circuit.

17. The voltage sensing circuit of claim 16, wherein the voltage comparator includes a transistor controlled by the monitoring unit to halt current flow through the voltage comparator when the bandgap generator is inadequately powered.

18. The voltage sensing circuit of claim 15, further comprising:

a voltage generator using resistors to divide the power supply voltage, thereby generating a first voltage, a second voltage lower than the first voltage, and a third voltage lower than the second voltage; and a switching circuit controlled by the monitoring unit to select the bandgap voltage when the bandgap generator is adequately powered and the first voltage when the bandgap generator is inadequately powered; wherein the monitoring unit compares the internal voltage of the bandgap generator with the first voltage; and the voltage comparator compares both the second and third voltages with the voltage selected by the switching circuit, thereby providing hysteresis in the sensing signal.

19. The voltage sensing circuit of claim 18, wherein the voltage comparator comprises:

a first comparator comparing the second voltage with the voltage selected by the switching circuit to generate a reset signal;

a second comparator comparing the third voltage with the voltage selected by the switching circuit to generate a set signal; and a flip-flop set by the set signal and reset by the reset signal, for outputting the sensing signal.

20. The voltage sensing circuit of claim 19, wherein the first comparator and the second comparator include respective transistors controlled by the monitoring unit to halt current flow through the first comparator and the second comparator when the bandgap generator is inadequately powered.

* * * * *